United States Patent [19]

Suzuki

[11] Patent Number: 4,799,180
[45] Date of Patent: Jan. 17, 1989

[54] ADAPTIVE AUTOMATIC EQUALIZER

[75] Inventor: Mitsuo Suzuki, Hino, Japan

[73] Assignee: Kabushiki Kaisha Toshiba, Kawasaki, Japan

[21] Appl. No.: 924,808

[22] Filed: Oct. 30, 1986

[30] Foreign Application Priority Data

Oct. 31, 1985 [JP] Japan .................. 60-245204

[51] Int. Cl.⁴ .............................. G06F 15/31
[52] U.S. Cl. ................................ 364/724.2
[58] Field of Search .............. 364/724; 375/15

[56] References Cited

U.S. PATENT DOCUMENTS

| | | | |
|---|---|---|---|
| 4,455,661 | 6/1984 | Qureshi | 375/8 |
| 4,475,211 | 10/1984 | Mattis, Jr. et al. | 364/724 |
| 4,539,690 | 9/1985 | Spiedel | 364/724 |
| 4,550,415 | 10/1985 | Debus, Jr. et al. | 364/72 X |
| 4,580,275 | 4/1986 | Pirani et al. | 364/724 |
| 4,591,669 | 5/1986 | Duttweiler et al. | 364/724 |
| 4,695,969 | 9/1987 | Sollenberger | 364/724 |
| 4,716,577 | 12/1987 | Oexmann | 375/18 |

Primary Examiner—Gary V. Harkcom
Assistant Examiner—Dale M. Shaw
Attorney, Agent, or Firm—Finnegan, Henderson, Farabow, Garrett, & Dunner

[57] ABSTRACT

An adaptive automatic equalizer of the type comprising a correction circuit for calculating a correction value for the weighting coefficients of an input signal at respective delay stages stored in the coefficient memory devices based on a difference signal between the output signal of the equalizer and a desired signal, and for correcting the weighting coefficients in accordance with the correction value, a detector for detecting a rapid change of the input signal, and an inhibiting circuit for inhibiting a substantial correction of the weighting coefficients effected by the correcting device when the rapid change is detected by the detector during an interval between the rapid change and return of the input signal to a stable state.

7 Claims, 4 Drawing Sheets

ADAPTIVE AUTOMATIC EQUALIZER

BACKGROUND OF THE INVENTION

1. Field of the Invention

This invention relates to an adaptive automatic equalizer that corrects an amplitude distortion or a phase distortion in an input signal when the signal is transmitted over a transmission path while adapting to the characteristic of the signal.

2. Description of the Prior Art

As is well known in the art, an equalizer has been used, for example, in a modulator/demodulator used in a transmission system in which data are transmitted in a voice bandwidth at a high speed of higher than 4800 bps, and such equalizer is essentially composed of a complex variable coefficient digital filter as is disclosed in the U.S. Pat. No. 3,950,635.

FIG. 5 is a block diagram showing the construction of a prior art adaptive automatic equalizer wherein an input signal X is corrected by correcting a weighting coefficient $C_n$ using an equation $$C_n = C_n + \alpha (\epsilon_m \cdot X_{nm}) \tag{1}$$

obtained by the mean square error method, a steepest drop method utilizing a square error obtained as an evaluation function. In equation (1), m represents a sampling number of the input signal X, and n represents the delay stage of the sampled value of the input signal X.

In FIG. 5, 1-1 through 1-n represent n signal memory devices that delay the input signal X by n stages, and 2-1 through 2-n are n coefficient memory devices provided corresponding to respective memory devices 1-1 through 1-n for storing weighting coefficients $C_1 - C_n$ ($C_i$) for input signals $X_1 - X_n$ ($X_i$) at respective delay stages, 3 represents a product sum accumulator which multiplies the input signal $X_i$ stored in the signal memory devices 1-1 through 1-n with the weighting coefficients $C_i$ stored in the coefficient memory devices 2-1 through 2-n at respective delay stages of the input signal, then accumulate the products thus obtained, and outputs the accumulated value Y as a signal Y obtained by correcting the distortions of the input signal $X_o$, 4 represents a calculator which multiplies an error signal $\epsilon$ representing the deviation of the output signal Y from a desired signal level, the complex conjugates $X_i^*$ of the input signals X stored in the signal memory devices 1-1 through 1-n, and the correction rate $\alpha$ of the weighting coefficient $C_i$ at respective delay stages of the input signal X, and outputs the product thus obtained as a correction value $\Delta Ci$ of the weighting coefficient $C_i$ at the respective delay stages stored in memory devices 2-1 through 2-n. The calculator 4 is constituted by a multiplier 5 that calculates $\epsilon X_i^*$, and a multiplier 6 that multiplies the product $\epsilon_x X_i^*$ with a correction rate $\alpha$. An adder 7 is provided for adding correction value $\Delta Ci$ of the weighting coefficient $C_i$ calculated by the calculator 4 and the coefficient $C_i$ stored in the ith coefficient memory device 1-i ($i = 1 - n$) and for storing the sum ($C_i + \Delta Ci$) in the ith coefficient memory device 2-i as a new coefficient $C_i$. The calculator 4 and the adder 7 constitutes a coefficient corrector.

With the construction described above, the algorithm shown in equation (1) is executed to correct the distortion in the input signal X.

At the time of initial equalization, for the purpose of quickly converging to an optimum equalized state, the correction rate $\alpha$ is transferred to a larger value $\alpha_1$ by a switch SW1, while the initial $C_o$ of $C_i$ is set by a switch SW2. The correction rate $\alpha$ is switched to a small value $\alpha_0$ at a suitable timing close to the optimum equalized state, while the coefficients $C_i$ for respective coefficient memory devices 2-1 through 2-n are set by the output of the adder 7.

With the above described construction, however, the correction rate $\alpha$ is switched between only two values $\alpha_1$ and $\alpha_0$ at two stable states in the initial state and a stable state of the automatic equalization. For this reason, the weighting coefficient $C_i$ will be updated even when the signal level changes rapidly due to quick interruption of the input signal after the equalizing characteristic has become stable. As a consequence, even after the stable state has been reached, the equalizing characteristic cannot be maintained due to a quick interruption of the input signal.

SUMMARY OF THE INVENTION

Accordingly, it is an object of this invention to provide a novel adaptive automatic equalizer capable of maintaining the equalizing characteristic under the stable state regardless of a rapid change in the input signal.

According to this invention, there is provided an adaptive automatic equalizer comprising a plurality of signal memory means for delaying an input signal at a plurality of stages; a plurality of coefficient memory means provided corresponding to respective signal memory means for storing weighting coefficients to be applied to the input signal at respective delay stages; product sum accumulating means for multiplying the input signal stored in respective memory means with the weighting coefficients stored in the coefficient memory means at respective delay stages, and for accumulating respective products thus obtained so as to produce a signal based on the result of the accumulation as a corrected input signal whose distortion is corrected; calculating means for calculating at respective delay stages a correction value for the weighting coefficients stored in the coefficient memory means based on a difference signal between an output signal of the product sum accumulating means and a desired signal; correcting means for correcting the weighting coefficients in accordance with the correction value calculated by the calculating means; detecting means for detecting a rapid change of the input signal; and means for inhibiting a substantial correction of the weighting coefficients to be effected by the correcting means when the rapid change is detected by the detecting means during an interval between the rapid changes of the input signal and return of the input signal to a stable state.

According to a preferred embodiment, the inhibiting means is constituted by a switch which transfers the correction coefficient of the weighting coefficient to zero during an interval between a rapid change of the input signal level and return of the signal level to a steady state.

With the above constructions, an equalization characteristics of a stable state can be maintained even when the level of the input signal is rapidly changed due to instantaneous interruption of the input signal, etc., and equalizing operations can be executed upon returning of the input signal level to the stable state.

DESCRIPTION OF THE PREFERRED EMBODIMENT

Figure 1:
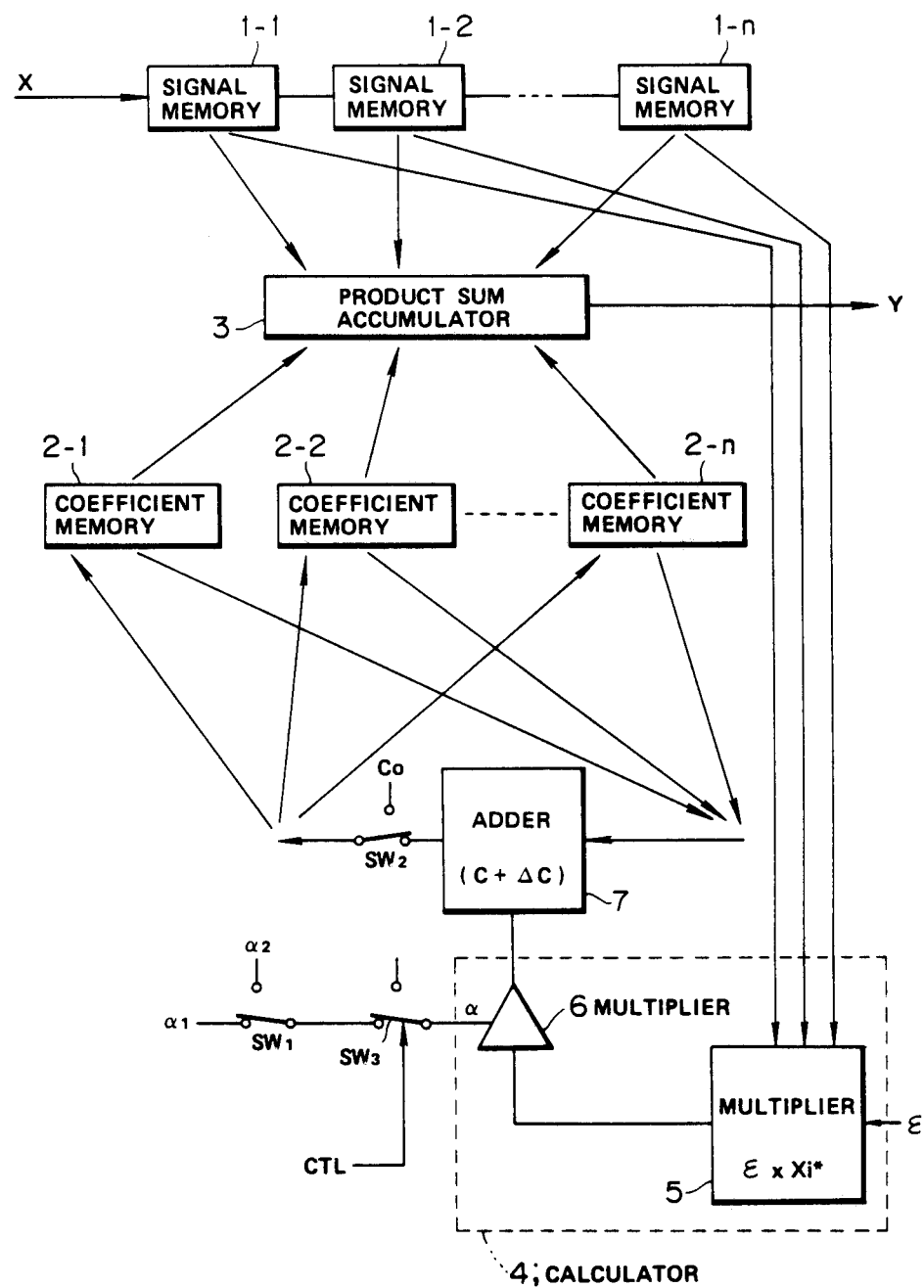
FIG. 1 is a block diagram showing one embodiment of the adaptive automatic equalizer according to this invention.
Figure 5:
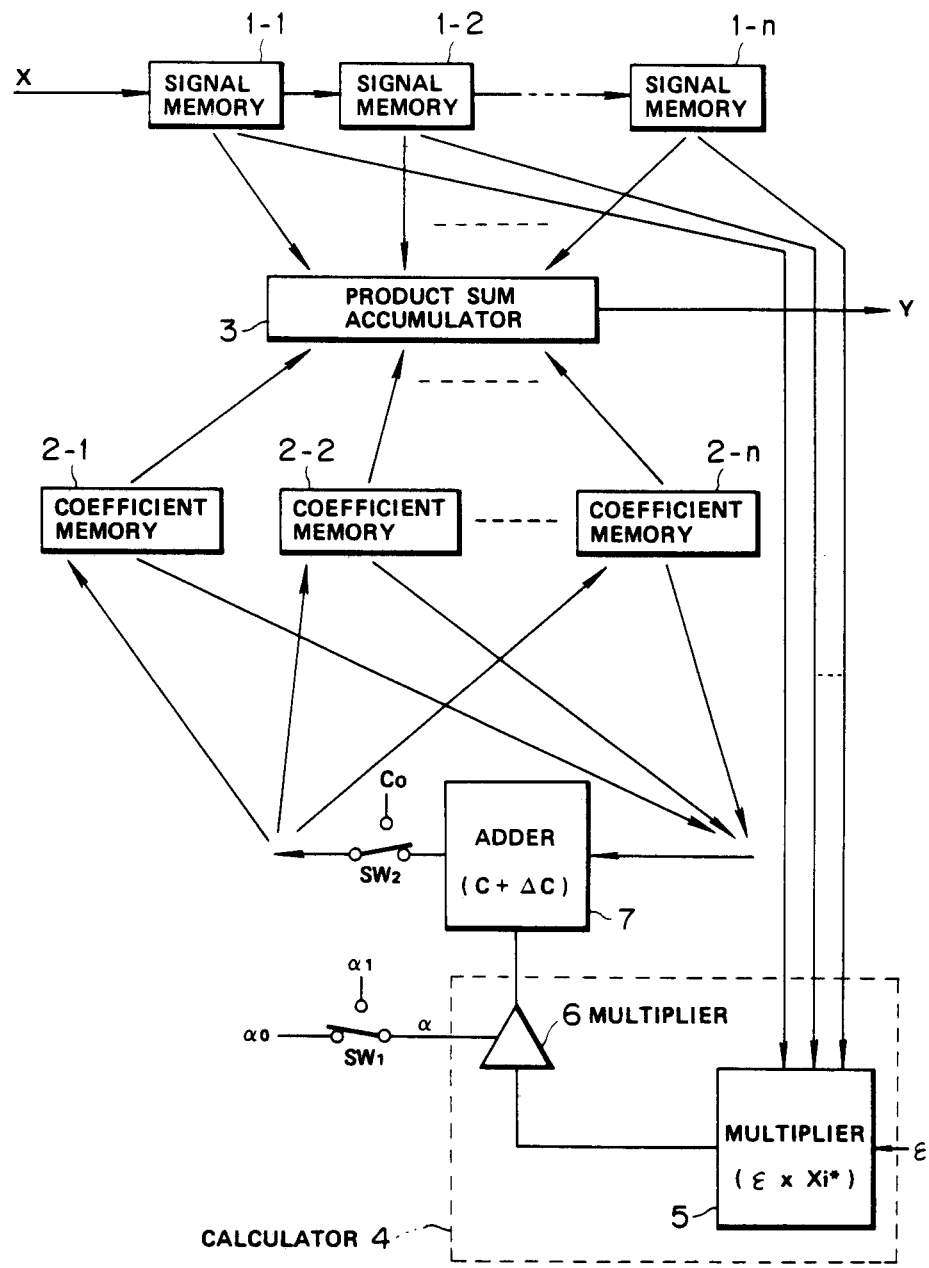
FIG. 5 is a block diagram showing a construction of a conventional adaptive automatic equalizer.

A preferred embodiment of this invention shown in FIG. 1 is essentially different from the conventional adaptive automatic equalizer shown in FIG. 5 in that a third switch SW3 is provided between a switch SW1 for supplying a correction rate $\alpha$ and a multiplier 6. The third switch SW3 is adopted to give to the multiplier 6 a correction rate $\alpha = 0$ during an interval between a rapid change of the input signal level and return to the stable state.

With this construction, since a correction rate $\alpha = 0$ is applied to the multiplier 6 during an interval between rapid variation in the level of the input signal X and return to the stable state, the correction value $\Delta C_i$ of the weighting coefficient $C_i$ becomes zero so as to maintain the coefficient $C_i$ at a state before level change. As the input signal X returns to the stable state, the switch SW3 is transferred from the zero level side to the side of the switch SW1 so that correction value $\Delta C_i$ will be controlled by the correction rate $\alpha$ given by the switch SW1.

Figure 2:
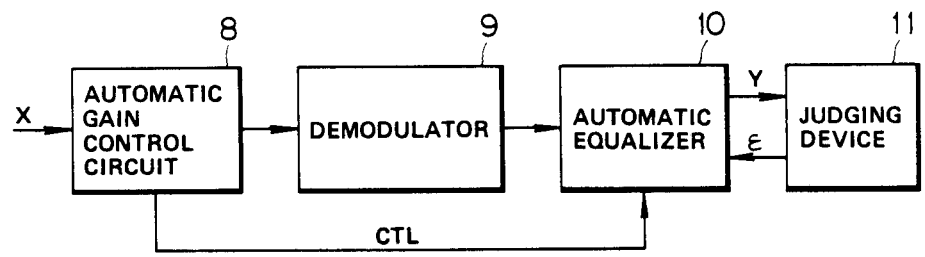
FIG. 2 is a block diagram showing a construction to which the automatic equalizer is applied.
Figure 3:
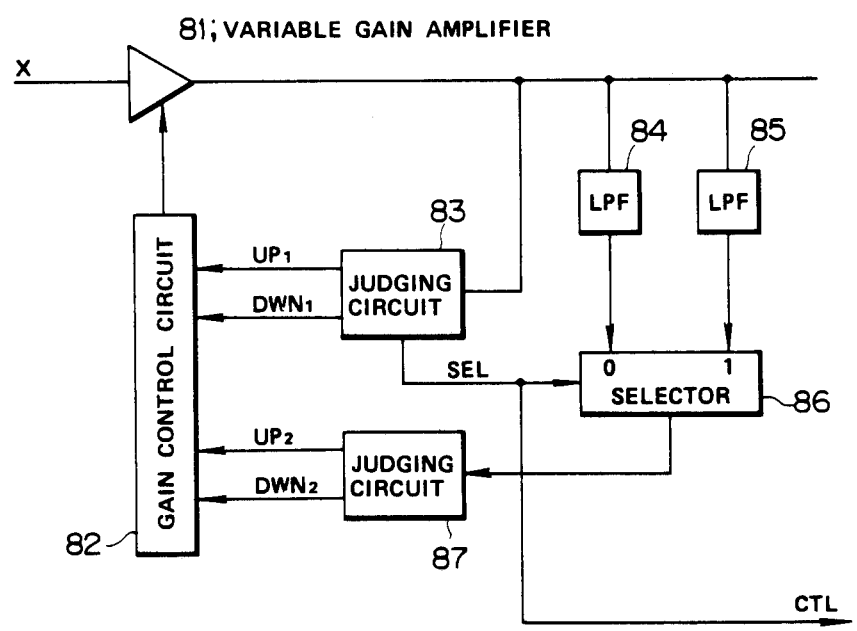
FIG. 3 shows a block diagram showing a construction of an automatic gain control circuit.

A control signal CTL for controlling the switch SW1 can readily be obtained from an automatic gain control circuit that automatically controls the amplification gain of the input signal X. As shown in FIG. 2, a modulator/demodulator utilizing an automatic equalizer of the type described above includes an automatic gain control circuit 8 for amplifying the input signal X to a predetermined level, a demodulator 9 for demodulating the amplified input signal X, an automatic equalizer 10 for correcting distortion of the demodulated input signal, and a judgment device 11 for judging an error between the output signal of the equalizer 10 and a signal (ideal signal) of a predetermined level. The detail of the automatic gain control circuit 8 is shown in FIG. 3 in which the circuit 8 comprises a variable gain amplifier 81 and a first judging circuit 83 for judging the level of the output signal from the variable gain amplifier 81 and for supplying to a gain control circuit 82 a signal UP1 that increases an amplification factor and a signal DWN1 that decreases the amplification factor. The first judging circuit 83 outputs a signal SEL which is "1" during a definite interval between an instant at which both signals UP1 and DWN1 are turned OFF and an instant at which either one of signals UP1 and DWN1 is turned ON and is "0" during other intervals. There are also provided two low pass filters 84 and 85 for calculating an average level of the output signal of the variable gain amplifier 81, a selector 86 for selecting either one of the output signals of the low pass filters 84 and 85 in accordance with the signal SEL outputted by the first judging circuit 83, and a second judging circuit 87 for judging the output signal level of the selector 86 so as to produce a signal UP2 for increasing the amplification factor of the gain control circuit 82 and a signal DWN2 for decreasing the amplification factor. When the signal SEL is "1", the selector 86 selects the output signal of the low pass filter 85, whereas the selector 86 selects the output signal of the low pass filter 84 when the signal SEL is "0". The cutoff frequency of the low pass filter 85 is set to be lower than that of the low pass filter 84, whereby the sensitivity of the low pass filter 85 is set to be higher. Regarding signals UP1, DWN1, UP2, and DWN2 to be applied to the gain control circuit 82, signals UP1 and DWN1 effect a higher degree of control upon the amplification factor so that, when the input signal level varies quickly, the amplification factor is varied quickly by the output signal UP1 or DWN1 of the first judging circuit 83. At this time, the judging circuit 83 outputs the signal SEL of "1" for causing the selector 86 to select the output signal of the low pass filter 85 having a higher sensitivity and to apply the output signal to the second judging circuit 87. Thus, the amplification factor of the variable gain amplifier 81 will be finely adjusted by the output signal UP2 or DW2 of the second judging circuit 87. When the output signal level of the variable gain amplifier 81 becomes stable as a result of the above adjustment, both output signals UP1 and DWN1 of the judging circuit 83 are turned OFF, and the signal SEL becomes "0". Consequently, after that, selector 86 selects the output signal of the low pass filter 84 and the judging circuit 87 finely adjusts the amplification factor of the variable gain amplifier 81 according to the result of judgment of the output signal level of the low pass filter 84.

Thus, it becomes possible to utilize the output signal SEL of the first judging circuit 83 as the signal CTL for controlling the switch SW3. More particularly, when signal SEL is "1", the switch SW3 is switched to the side of correction rate $\alpha = 0$.

Although in the foregoing embodiment, a correction rate of $\alpha = 0$ was applied to the multiplexer 6 by operating the third switch SW3, so as to prevent variation of the contents of the coefficient memory devices 2-1 through 2-n during an interval between quick change in the signal level and return to the stable state, it should be understood that use of switch SW3 is not always necessary. It is only necessary to construct the circuit such that the contents of the coefficient memory devices 2-1 through 2-n can be maintained at predetermined values at an instant prior to a rapid change of the input signal level during an interval between the rapid change of the input signal level and return to the stable state.

Figure 4:
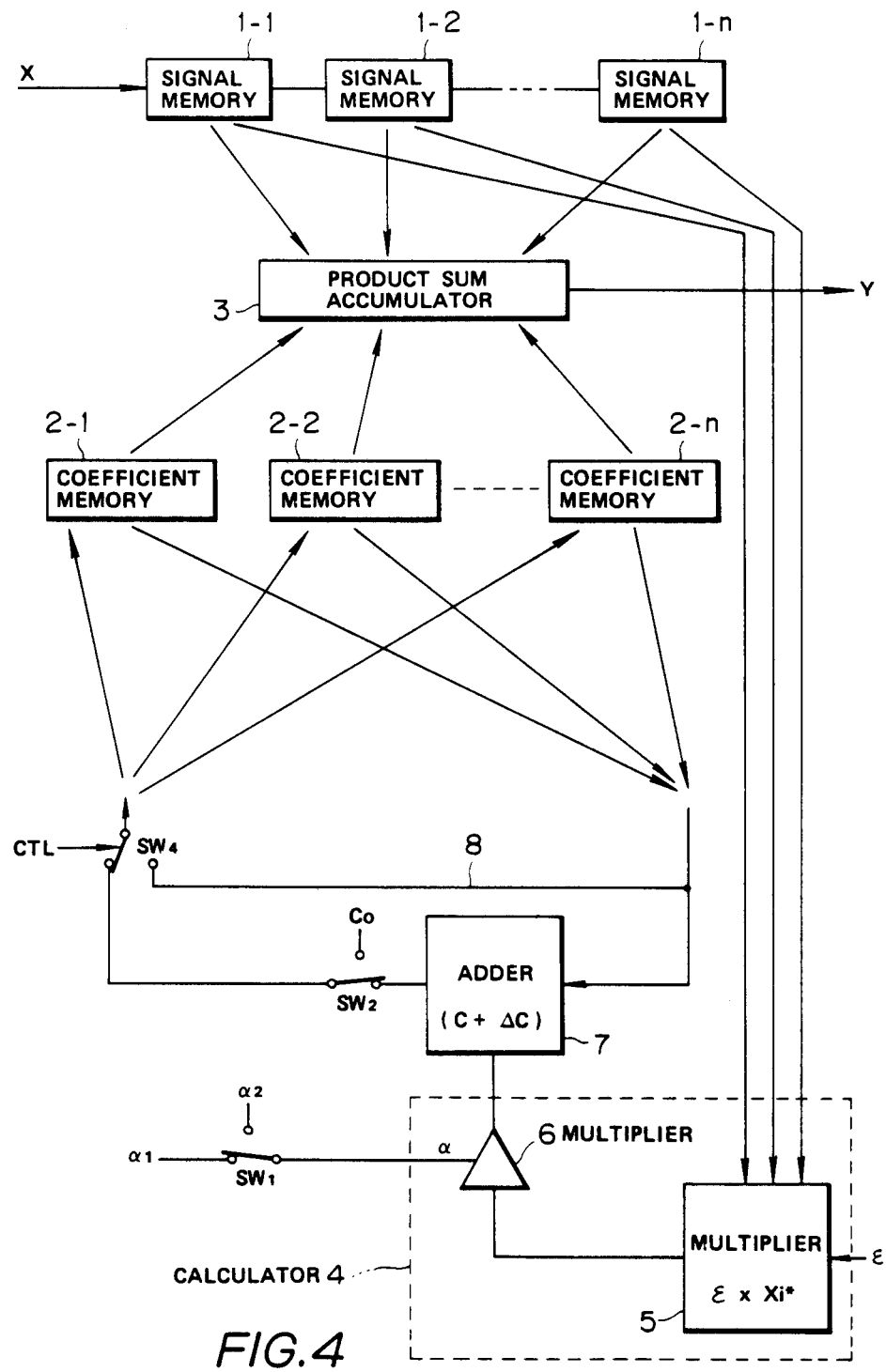
FIG. 4 is a block diagram showing a modified embodiment of this invention.

FIG. 4 is a block diagram showing a modified embodiment of this invention. In this embodiment, a by-pass line 8 is connected to adder 7, and a switch SW4 is provided for selecting either one of the output signal from adder 7 and the signal on the bypass line 8. The switch SW4 operates to select the signal on the bypass line 8 during an interval between the rapid change of the input signal level and return to the stable state.

More particularly, according to this modified embodiment, during an interval between the rapid change of the input signal level and return to the stable state, the adder 7 is disconnected from the coefficient memory devices 2-1 through 2-n so that their contents are maintained at a state prior to the rapid change of the input signal, whereby the equalizer operates not as a adaptive but as a fixed automatic equalizer.

What is claimed is:

1. An adaptive automatic equalizer comprising:

a plurality of signal memory means for delaying an input signal at a plurality of stages;

a plurality of coefficient memory means for storing weighting coefficients to be applied to said input signal at respective delay stages, each of said coefficient memory means corresponding to a respective one of said signal memory means;

product sum accumulating means for multiplying said input signal stored in each of said signal memory means with said weighting coefficients stored in respective ones of said coefficient memory means at respective delay stages, and for accumulating respective products thus obtained so as to produce a signal based on the result of the accumulation as a corrected input signal whose distortion is corrected;

calculating means for calculating at respective delay stages a correction value for said weighting coefficients stored in said coefficient memory means based on a difference signal between an output signal of said product sum accumulating means and a desired signal, wherein said calculating means includes a multiplier for multiplying a difference between said input signal corrected by said product accumulating means and said desired signal with a complex conjugate of the input signals stored in said signal memory means and the correction rate of said weighting coefficient at each delay state of said input signal, thereby obtaining a correction value of the weighting coefficient for each delay stage;

correcting means for correcting said weighting coefficients in accordance with the correction value calculated by said calculating means;

detecting means for detecting a rapid change of said input signal; and means for inhibiting a substantial correction of said weighting coefficients to be effected by said correcting means when said rapid change is detected by said detecting means during an interval between said rapid change of said input signal and return of said input signal to a stable state.

2. The adaptive automatic equalizer according to claim 1 wherein said inhibiting means comprises switching means for transferring the correction rate of said weighting coefficient to zero during an interval between rapid change of said input signal and return to a stable state of said input signal.

3. The adaptive automatic equalizer according to claim 1, further comprising an automatic gain control circuit for automatically controlling an amplifying gain of said input signal and wherein said detecting means is provided for said automatic gain control circuit.

4. An adaptive automatic equalizer comprising:

a plurality of signal memory means for delaying an input signal at a plurality of stages;

a plurality of coefficient memory means for storing weighting coefficients to be applied to said input signal at respective delay stages, each of said coefficient memory means corresponding to a respective one of said signal memory means;

product sum accumulating means for multiplying said input signal stored in each of said signal memory means with said weighting coefficients stored in respective ones of said coefficient memory means at espective delay stages, and for accumulating respective products thus obtained so as to produce a signal based on the result of the accumulation as a corrected input signal whose distortion is corrected;

calculating means for calculating at respective delay stages a correction value for said weighting coefficients stored. in said coefficient memory means based on a difference signal between an output signal of said product sum accumulating means and a desired signal;

correcting means for correcting said weighting coefficients in accordance with the correction value calculated by said calculating means;

detecting means for detecting a rapid change of said input signal; and means for inhibiting a substantial correction of said weighting coefficients to be effected by said correcting means when said rapid change is detected by said detecting means during an interval between said rapid change of said input signal and return of said input signal to a stable state, wherein said means for inhibiting also includes a bypass means for bypassing said correction means; a switch means for selecting either one of an output signal of said correcting means and an output signal of said bypass means so that said switch means selects the output of said bypass means during an interval between the rapid change of said input signal and the return of said input signal to a stable state.

5. The adaptive automatic equalizer according to claim 4, further comprising an automatic gain control circuit for automatically controlling an amplifying gain of said input signal and wherein said detecting means is provided for said automatic gain control circuit.

6. The adaptive automatic equalizer according to claim 3 wherein said automatic gain control circuit comprises a selector which switches gain control sensitivities in response to the levels of said input signal and outputs a signal as an output of said detecting means.

7. The adaptive automatic equalizer according to claim 5 wherein said automatic gain control circuit comprises a selector which switches gain control sensitivities in response to the levels of said input signal and outputs a signal as an output of said detecting means.

* * * * *

UNITED STATES PATENT AND TRADEMARK OFFICE
CERTIFICATE OF CORRECTION

PATENT NO. : 4,799,180

DATED : Jaunuary 17, 1989

INVENTOR(S) : MITSUO SUZUKI

It is certified that error appears in the above-identified patent and that said Letters Patent is hereby corrected as shown below:

Claim 1, Column 5, Line 30 change "each delay state" to --each delay stage--.

Signed and Sealed this

Fifteenth Day of May, 1990

Attest:

HARRY F. MANBECK, JR.

*Attesting Officer*  *Commissioner of Patents and Trademarks*

UNITED STATES PATENT AND TRADEMARK OFFICE
CERTIFICATE OF CORRECTION

PATENT NO. : 4,799,180
DATED : January 17, 1989
INVENTOR(S) : MITSUO SUZUKI

It is certified that error appears in the above-identified patent and that said Letters Patent is hereby corrected as shown below:

Claim 4, Column 6, Line 12 change "espective" to -- respective --.

Signed and Sealed this

Eighteenth Day of June, 1991

Attest:

HARRY F. MANBECK, JR.

Attesting Officer

Commissioner of Patents and Trademarks